(12) United States Patent
Hao et al.

(10) Patent No.: US 10,406,807 B1
(45) Date of Patent: Sep. 10, 2019

(54) INKJET PRINTER AND PRINTING METHOD THEREOF

(71) Applicant: Shenzhen China Star Optoelectronics Semiconductor Display Technology Co., Ltd., Shenzhen, Guangdong (CN)

(72) Inventors: Peng Hao, Shenzhen (CN); Yuan-Chun Wu, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/775,064

(22) PCT Filed: Mar. 13, 2018

(86) PCT No.: PCT/CN2018/078772
§ 371 (c)(1),
(2) Date: May 10, 2018

(30) Foreign Application Priority Data

Mar. 5, 2018 (CN) .......................... 2018 1 0177505

(51) Int. Cl.
*B41J 2/045* (2006.01)
*B41J 29/393* (2006.01)
*H01L 51/56* (2006.01)
*H01L 51/00* (2006.01)
*B41M 5/00* (2006.01)

(52) U.S. Cl.
CPC ........... *B41J 2/0456* (2013.01); *B41J 29/393* (2013.01); *B41M 5/0047* (2013.01); *H01L 51/0005* (2013.01); *H01L 51/56* (2013.01)

(58) Field of Classification Search
CPC .... B41J 2/0456; B41J 29/393; B41M 5/0047; H01L 51/0005; H01L 51/56
See application file for complete search history.

(56) References Cited

U.S. PATENT DOCUMENTS

2018/0233667 A1* 8/2018 Wang .................. H01L 51/0005

* cited by examiner

*Primary Examiner* — Bradley W Thies
(74) *Attorney, Agent, or Firm* — Mark M. Friedman

(57) ABSTRACT

An inkjet printer and a method thereof is disclosed. The inkjet printer, for fabricating an organic light-emitting diode device, includes a printing control apparatus, a main printing apparatus, a volume detection apparatus, and a compensation printing apparatus. The volume detection apparatus is capable of detecting volume and printing locations of a printing solution which needs to be compensated as soon as a main printing apparatus carrying out a primary printing, so that the compensation printing apparatus is capable of carrying out a compensation printing on the printing solution which needs printing compensation.

15 Claims, 4 Drawing Sheets

INKJET PRINTER AND PRINTING METHOD THEREOF

CROSS REFERENCE TO RELATED APPLICATIONS

This application is a U.S. National Phase application submitted under 35 U.S.C. § 371 of Patent Cooperation Treaty Application serial No. PCT/CN2018/078772, filed Mar. 13, 2018, which claims the priority of China Patent Application serial No. 201810177505.3, filed Mar. 5, 2018, the disclosures of which are incorporated herein by reference in their entirety.

BACKGROUND OF INVENTION

1. Field of Invention

The present invention relates to a display field, and particularly to an inkjet printer and printing method thereof.

2. Related Art

Organic light-emitting diode (OLED) devices have become novel display devices having most potential due to advantages of being self-luminous, all-solid, and high contrast, etc.

Film formation of OLED devices generally includes an evaporation process and a solution process. The evaporation process has been widely used in manufacturing small size display panels. The solution process includes inkjet printing, nozzle coating, spin coating, screen coating and the like, wherein inkjet printing is considered an important method for producing large size display panels.

Major processes for preparing OLEDs by inkjet printing are as follows:
(1) dropping a precise volume of droplets into a predetermined position and a pixel opening on a substrate;
(2) drying the droplets into a thin film by vacuum pressure reduction;
(3) performing an annealing treatment to improve quality of the thin film of the obtained OLED.

To ensure uniformity of all the light emitting regions of the screen, each sub-pixel of the OLED layer is required to have a same thickness. That is, each sub-pixel is required to be printed with a same volume of an OLED solution during a printing process, and is capable of compensating a thickness variation of an OLED film after formation of the OLED film.

A specification of 8 to 12 picoliters is adopted in current mainstream ink-jet printing nozzles. However, dropping precision of each drop from a printing head is quite different from one another, and droplets ejected from different nozzles of a same printing head are not assured to have the same volume. Generally, droplet volume variation of droplets from different nozzles ranges from ±10%. Therefore, to improve droplet volume variation of droplets among sub-pixels is the direct way to improve uneven brightness of a screen.

To ensure consistency and accuracy of the volume of droplets printed in sub-pixels, it is currently urgently needed for a method for improving volume variation of droplets among sub-pixels.

SUMMARY OF INVENTION

Accordingly, an object of the present invention is to provide an inkjet printer and a printing method thereof for overcoming the problem of uneven brightness of a screen caused by considerable printing volume variation of an organic light-emitting diode solution among different sub-pixels during a printing process of an organic light-emitting diode device.

To achieve the above object, technical solutions of the present invention are as follows:

In one aspect of the present invention, the present invention provides an inkjet printer for fabricating an organic light-emitting diode (OLED) device. The inkjet printer comprises a printing control apparatus, a main printing apparatus, a volume detection apparatus, and a compensation printing apparatus.

The printing control apparatus is provided for controlling the main printing apparatus to carry out a primary printing with an OLED solution for forming the OLED device, and for controlling the compensation printing apparatus to carry out a compensation printing with the OLED solution.

The main printing apparatus comprises a main printing head for carrying out the primary printing with the OLED solution.

The volume detection apparatus is provided for detecting volume of the OLED solution on sub-pixels after the primary printing with the OLED solution, and generating and transmitting volume data of the OLED device to the printing control apparatus.

The compensation printing apparatus comprises a compensation printing head for carrying out the compensation printing with the OLED solution.

The main printing head has a printing specification of 8 to 12 picoliters, and the compensation printing head has a printing specification equal to or less than one picoliter.

In one embodiment of the present invention, the printing control apparatus comprises a first driving module, a data processing module, and a second driving module.

The first driving module carries out the primary printing with the OLED solution according to printing requirements of the OLED solution.

The data processing module, after receiving the volume data, generates a sub-pixel compensation table containing locations and compensation volume for the sub-pixels which need printing compensation.

The second driving module carries out the compensation printing with the OLED solution according to the sup-pixel compensation table.

In another embodiment of the present invention, the compensation printing is carried out on the sub-pixels for which volume of the OLED solution is insufficient after the primary printing is completed.

In another embodiment of the present invention, the volume detection apparatus is disposed to a rear of a moving direction of the main printing head with respect to a substrate for carrying out the primary printing.

In another embodiment of the present invention, the volume detection apparatus detects the volume of the OLED solution of the sub-pixels as soon as the main printing head completes its printing.

In another embodiment of the present invention, a main shaft is provided through which the printing control apparatus drives the main printing apparatus to carry out the primary printing.

In another aspect of the present invention, a printing method of fabricating an OLED device is provided. The printing method comprises:

Step S10, providing an inkjet printer, comprising a printing control apparatus, a main printing apparatus, a volume detection apparatus, and a compensation printing apparatus.

Step S20, the main printing apparatus carrying out the primary printing on sub-pixels on a substrate, the volume detection apparatus detecting how much volume of an OLED solution is used on the sub-pixels where the primary printing is carried out, and the volume detection apparatus generating and transmitting volume data of the OLED device to the printing control apparatus; wherein the main printing apparatus comprises a main printing head.

Step S30, the compensation printing apparatus carrying out a compensation printing on the sub-pixels under control of the printing control apparatus to eliminate volume variation of the OLED solution caused by the primary printing.

In one embodiment of the present invention, the volume detection apparatus is disposed to a rear of a moving direction of the main printing head with respect to a substrate for carrying out the primary printing.

In another embodiment of the present invention, the step S30 specifically comprises:

Step S301, the printing control apparatus, after receiving volume data, generating a sub-pixel compensation table containing locations and compensation volume for the sub-pixels which need printing compensation.

Step S302, after receiving the sub-pixel compensation table, the compensation printing apparatus carrying out the compensation printing on the sub-pixels according to the sub-pixel compensation table.

In another aspect of the present invention, the present invention provides an inkjet printer for fabricating an organic light-emitting diode (OLED) device. The inkjet printer comprises a printing control apparatus, a main printing apparatus, a volume detection apparatus, and a compensation printing apparatus.

The printing control apparatus is provided for controlling the main printing apparatus to carry out a primary printing with an OLED solution for forming the OLED device, and for controlling the compensation printing apparatus to carry out a compensation printing with the OLED solution.

The main printing apparatus comprises a main printing head for carrying out the primary printing with the OLED solution.

The volume detection apparatus is provided for detecting how much volume of the OLED solution is used on sub-pixels of the OLED device after the primary printing with the OLED solution, and generating and transmitting volume data to the printing control apparatus.

The compensation printing apparatus comprises a compensation printing head for carrying out the compensation printing with the OLED solution.

In one embodiment of the present invention, the printing control apparatus comprises a first driving module, a data processing module, and a second driving module.

The first driving module carries out the primary printing according to printing requirements of the OLED solution.

The data processing module, after receiving volume data, generates a sub-pixel compensation table containing locations and compensation volume for the sub-pixels which need compensation of printing.

The second driving module carries out the compensation printing of the OLED solution according to the sup-pixel compensation table.

In one embodiment of the present invention, the compensation printing is carried out on the sub-pixels for which volume of the OLED solution is insufficient after the primary print is completed.

In one embodiment of the present invention, the volume detection apparatus is disposed to a rear of a moving direction of the main printing head with respect to a substrate for carrying out the primary printing.

In one embodiment of the present invention, the volume detection apparatus detects the volume of the OLED solution of the sub-pixels as soon as the main printing head completes its printing.

In one embodiment of the present invention, a main shaft is provided through which the printing control apparatus drives the main printing apparatus to carry out the primary printing.

The advantages of the present invention are as follows: the present invention provides an inkjet printer and a printing method thereof. By providing the volume detection apparatus and the compensation printing apparatus in the inkjet printer, the volume detection apparatus detects volume of a printing solution as soon as the primary printing is completed, and the compensation printing apparatus carries out the compensation printing on the printing solution which needs printing compensation, thereby to ensure uniformity of a film layer of the OLED device and to improve display performance of a screen.

DESCRIPTION OF PREFERRED EMBODIMENTS

Figure 1:
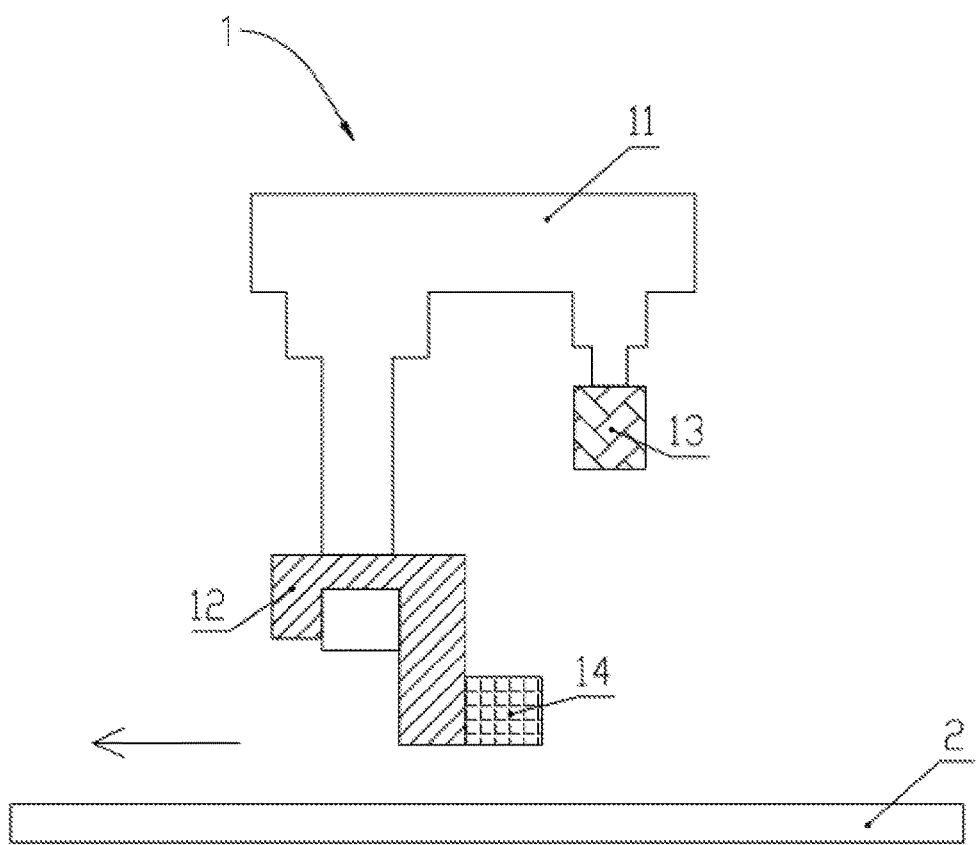
FIG. 1 is a schematic structural view of an inkjet printer of the present invention.

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, elements with similar structures are labeled with like reference numerals.

The present invention provides an inkjet printer and a printing method thereof for overcoming the problem of uneven brightness of a screen caused by considerable printing volume variation of an organic light-emitting diode solution among different sub-pixels during a printing process of an organic light-emitting diode device.

Figure 2:
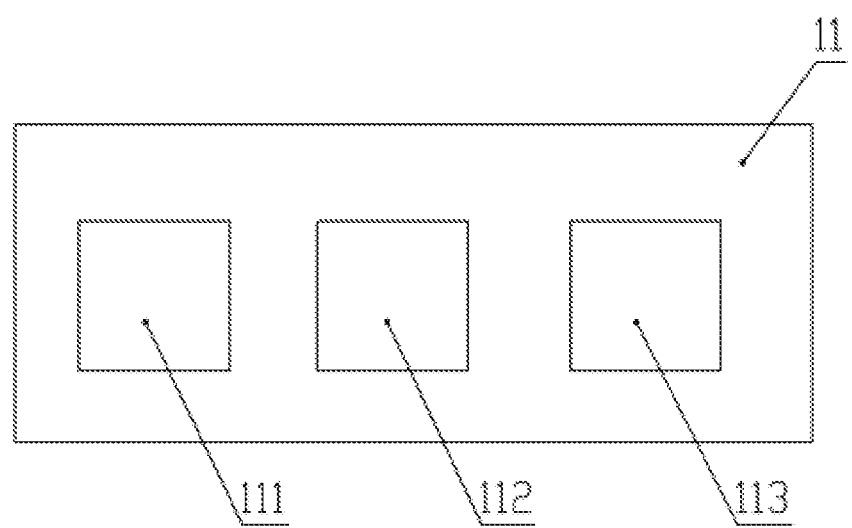
FIG. 2 is a schematic structural view of a printing control apparatus of the present invention.

FIG. 1 is a schematic structural view of an inkjet printer of the present invention, and FIG. 2 is a schematic structural view of a printing control apparatus of the present invention.

The present invention provides an inkjet printer 1 for fabricating an organic light-emitting diode (OLED) device. The inkjet printer 1 comprises a printing control apparatus 11, a main printing apparatus 12, a volume detection apparatus 14, and a compensation printing apparatus 13.

The printing control apparatus 11 is provided for controlling the main printing apparatus 12 to carry out a primary printing with an OLED solution for forming the OLED device, and for controlling the compensation printing apparatus 13 to carry out a compensation printing with the OLED solution.

As shown in FIG. 2, the printing control apparatus 11 comprises a first driving module 111, a data processing module 112, and a second driving module 113.

The first driving module 111 carries out the primary printing with the OLED solution according to printing requirements of the OLED solution.

The data processing module 112, after receiving the volume data, generates a sub-pixel compensation table containing locations and compensation volume for the sub-pixels which need printing compensation.

The second driving module 113 carries out the compensation printing with the OLED solution according to the sub-pixel compensation table.

The main printing apparatus 12 comprises a main printing head for carrying out the primary printing with the OLED solution.

The volume detection apparatus 14 is provided for detecting how much volume of the OLED solution is used on the sub-pixels after the primary printing with the OLED solution, and for generating and transmitting volume data of the OLED solution to the printing control apparatus 11.

The present invention utilizes the compensation printing to compensate for insufficient printing of the primary printing, and thus is capable of efficiently compensating for insufficient solution volume on sub-pixels of the primary printing, thereby to improve volume uniformity of the OLED device.

Specifically, the OLED solution is printed on the sub-pixels. The sub-pixels are disposed on an upper surface of a substrate 2. A printing direction of the inkjet printing with respect to the substrate 2 is shown in FIG. 1.

The compensation printing apparatus comprises a compensation printing head for carrying out the compensation printing with the OLED solution.

In one embodiment of the present invention, the compensation printing is carried out on the sub-pixels for which volume of the OLED solution is insufficient after the primary printing is completed.

Further shown in FIG. 1, the volume detection apparatus 14 is disposed to a rear of a moving direction of the main printing head with respect to the substrate 2 for carrying out the primary printing. In this manner, as soon as the main printing head completes its printing, the volume detection apparatus 14 is capable of detecting printing performance and rapidly transmitting related data to the printing control apparatus 11.

The main printing head has a printing specification of 8 to 12 picoliters, and the compensation printing head has a printing specification equal to or less than one picoliter. By setting the printing specification of the compensation printing head far less than that of the main printing head, it efficiently improves precision of the compensation printing, and thus improves performance of the compensation printing.

Generally, a main shaft is provided through which the printing control apparatus 11 drives the main printing apparatus 12 to carry out the primary printing. Also, the main shaft is provided through which the printing control apparatus 11 drives the compensation printing apparatus 13 to carry out the compensation printing. The main shaft is operated in a telescopic and transposition manner to enable shifting of the primary printing and the compensation printing, thereby to improve shifting performance of two printing modes.

Figure 3:
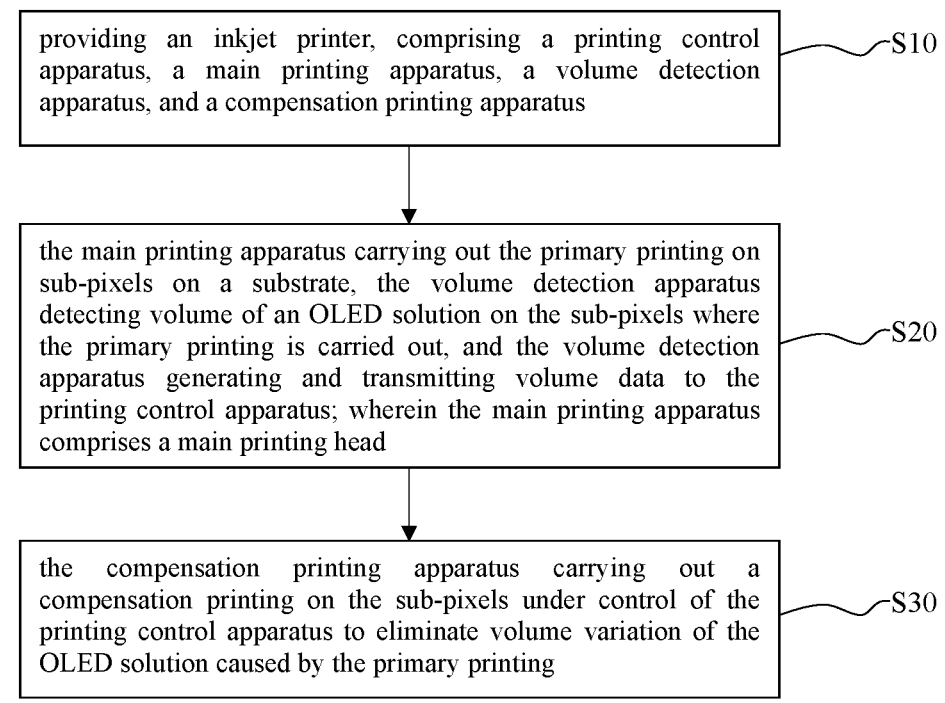
FIG. 3 is a flowchart of a printing method of fabricating an organic light-emitting diode device of the present invention.
Figure 4:
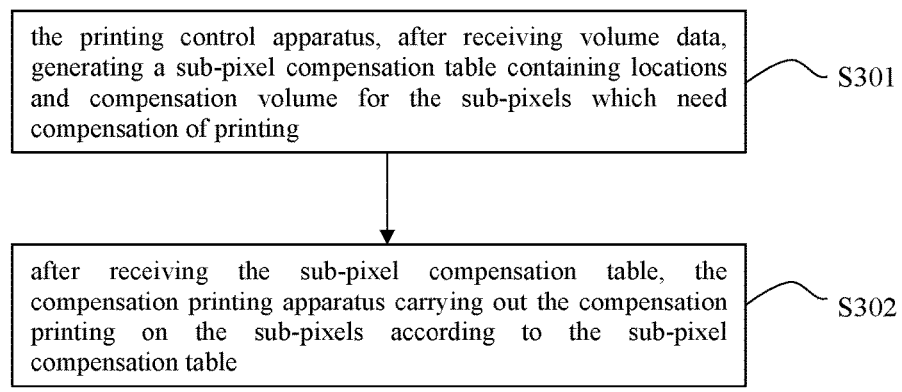
FIG. 4 is a schematic flowchart showing an embodiment of step S30 of FIG. 3.

As shown in FIG. 3 and FIG. 4, according to the present invention, a printing method of fabricating an OLED device comprises:

step S10, providing an inkjet printer, comprising a printing control apparatus, a main printing apparatus, a volume detection apparatus, and a compensation printing apparatus;

step S20, the main printing apparatus carrying out the primary printing on sub-pixels on a substrate, the volume detection apparatus detecting how much volume of an OLED solution is used on the sub-pixels where the primary printing is carried out, and the volume detection apparatus generating and transmitting volume data to the printing control apparatus; wherein the main printing apparatus comprises a main printing head; step S30, the compensation printing apparatus carrying out a compensation printing on the sub-pixels under control of the printing control apparatus to eliminate volume variation of the OLED solution caused by the primary printing.

Furthermore, the volume detection apparatus is disposed to a rear of a moving direction of the main printing head with respect to a substrate for carrying out the primary printing.

The step S30 specifically comprises step S301, the printing control apparatus, after receiving volume data, generating a sub-pixel compensation table containing locations and compensation volume for the sub-pixels which need printing compensation; and step S302, after receiving the sub-pixel compensation table, the compensation printing apparatus carrying out the compensation printing on the sub-pixels according to the sub-pixel compensation table.

The working principle of the printing method of the OLED device of the present invention is consistent with the working principle of current existing ink-jet printers, and specifics of the working principle of the printing method of the OLED device can be referred to the working principle of current existing ink-jet printers. Details are not repeatedly described herein.

The present invention provides an inkjet printer and a printing method thereof. By providing the volume detection apparatus and the compensation printing apparatus in the inkjet printer, the volume detection apparatus detects volume of a printing solution as soon as the primary printing is completed, and the compensation printing apparatus carries out the compensation printing on the printing solution which needs printing compensation, thereby to ensure uniformity of a film layer of the OLED device and to improve display performance of a screen.

It is understood that the invention may be embodied in other forms within the scope of the claims. Thus the present examples and embodiments are to be considered in all respects as illustrative, and not restrictive, of the invention defined by the claims.

What is claimed is:

1. An inkjet printer for fabricating an organic light-emitting diode (OLED) device, comprising:

a printing control apparatus, a main printing apparatus, a volume detection apparatus, and a compensation printing apparatus;

the printing control apparatus provided for controlling the main printing apparatus to carry out a primary printing with an OLED solution for forming the OLED device, and for controlling the compensation printing apparatus to carry out a compensation printing with the OLED solution;

the main printing apparatus comprising a main printing head for carrying out the primary printing with the OLED solution;

the volume detection apparatus provided for detecting how much volume of the OLED solution is used on sub-pixels of the OLED device after the primary printing with the OLED solution, and generating and transmitting volume data of the OLED solution to the printing control apparatus; and the compensation printing apparatus comprising a compensation printing head for carrying out the compensation printing with the OLED solution;

wherein the main printing head has a printing specification of 8 to 12 picoliters, and the compensation printing head has a printing specification equal to or less than one picoliter.

2. The inkjet printer of claim 1, wherein the printing control apparatus comprises a first driving module, a data processing module, and a second driving module;

the first driving module carrying out the primary printing with the OLED solution according to printing requirements of the OLED solution;

the data processing module, after receiving the volume data, generating a sub-pixel compensation table containing locations and compensation volume for the sub-pixels which need printing compensation; and the second driving module carrying out the compensation printing with the OLED solution according to the sup-pixel compensation table.

3. The inkjet printer of claim 2, wherein the compensation printing is carried out on the sub-pixels for which volume of the OLED solution is insufficient after the primary printing is completed.

4. The inkjet printer of claim 1, wherein the volume detection apparatus is disposed to a rear of a moving direction of the main printing head with respect to a substrate for carrying out the primary printing.

5. The inkjet printer of claim 1, wherein the volume detection apparatus detects the volume of the OLED solution of the sub-pixels as soon as the main printing head completes its printing.

6. The inkjet printer of claim 1, wherein a main shaft is provided through which the printing control apparatus drives the main printing apparatus to carry out the primary printing.

7. A printing method of fabricating an organic light-emitting diode (OLED) device, the printing method comprising:

step S10, providing an inkjet printer, comprising a printing control apparatus, a main printing apparatus, a volume detection apparatus, and a compensation printing apparatus;

step S20, the main printing apparatus carrying out the primary printing on sub-pixels on a substrate, the volume detection apparatus detecting volume of an OLED solution on the sub-pixels where the primary printing is carried out, and the volume detection apparatus generating and transmitting volume data of the OLED solution to the printing control apparatus; wherein the main printing apparatus comprises a main printing head; and step S30, the compensation printing apparatus carrying out a compensation printing on the sub-pixels under control of the printing control apparatus to eliminate volume variation of the OLED solution caused by the primary printing.

8. The printing method of claim 7, wherein the volume detection apparatus is disposed to a rear of a moving direction of the main printing head with respect to a substrate for carrying out the primary printing.

9. The printing method of claim 7, wherein the step S30 comprises:

step S301, the printing control apparatus, after receiving volume data, generating a sub-pixel compensation table containing locations and compensation volume for the sub-pixels which need printing compensation; and step S302, after receiving the sub-pixel compensation table, the compensation printing apparatus carrying out the compensation printing on the sub-pixels according to the sub-pixel compensation table.

10. An inkjet printer for fabricating an organic light-emitting diode (OLED) device, comprising:

a printing control apparatus, a main printing apparatus, a volume detection apparatus, and a compensation printing apparatus;

the printing control apparatus provided for controlling the main printing apparatus to carry out a primary printing with an OLED solution for forming the OLED device, and for controlling the compensation printing apparatus to carry out a compensation printing with the OLED solution;

the main printing apparatus comprising a main printing head for carrying out the primary printing with the OLED solution;

the volume detection apparatus provided for detecting how much volume of the OLED solution is used on sub-pixels of the OLED device after the primary printing with the OLED solution, and generating and transmitting volume data of the OLED solution to the printing control apparatus; and the compensation printing apparatus comprising a compensation printing head for carrying out the compensation printing with the OLED solution.

11. The inkjet printer of claim 10, wherein the printing control apparatus comprises a first driving module, a data processing module, and a second driving module;

the first driving module carrying out the primary printing according to printing requirements of the OLED solution;

the data processing module, after receiving volume data, generating a sub-pixel compensation table containing locations and compensation volume for the sub-pixels which need printing compensation; and the second driving module carrying out the compensation printing of the OLED solution according to the sup-pixel compensation table.

12. The inkjet printer of claim 10, wherein the compensation printing is carried out on the sub-pixels for which volume of the OLED solution is insufficient after the primary print is completed.

13. The inkjet printer of claim 10, wherein the volume detection apparatus is disposed to a rear of a moving direction of the main printing head with respect to a substrate for carrying out the primary printing.

14. The inkjet printer of claim 10, wherein the volume detection apparatus detects the volume of the OLED solution of the sub-pixels as soon as the main printing head completes its printing.

15. The inkjet printer of claim 10, wherein a main shaft is provided through which the printing control apparatus drives the main printing apparatus to carry out the primary printing.

* * * * *